United States Patent [19]
Deno

[11] 4,277,745
[45] Jul. 7, 1981

[54] PERSONAL ELECTRIC FIELD EXPOSURE MONITOR

[75] Inventor: Don W. Deno, West Stockbridge, Mass.

[73] Assignee: Electric Power Research Institute, Inc., Palo Alto, Calif.

[21] Appl. No.: 29,330

[22] Filed: Apr. 12, 1979

[51] Int. Cl.³ ............................................ G01R 31/02
[52] U.S. Cl. ..................................... 324/72; 324/189; 324/457; 324/76 A; 368/121
[58] Field of Search ................. 324/72 R, 77 A, 76 R, 324/189, 458, 457, 76 A

[56] References Cited

U.S. PATENT DOCUMENTS 3,360,723  12/1967  Royce .............................. 324/77 A
3,742,352  6/1973  Euer et al. .......................... 324/77 A

OTHER PUBLICATIONS

Deno, Don W. "Currents Induced in the Human Body by High Voltage Transmission Line Electric Field—Measurement and Calculation of Distribution and Dose," IEEE Transactions on Power Apparatus and Systems, vol. PAS 96, No. -5, Sep./Oct. 1977 pp. 1517–1527.

Primary Examiner—David K. Moore
Attorney, Agent, or Firm—Flehr, Hohbach, Test, Albritton and Herbert

[57] ABSTRACT

A low frequency electric field exposure monitor integrates personal exposure to an electric field into intervals of electric field intensity.

6 Claims, 2 Drawing Figures

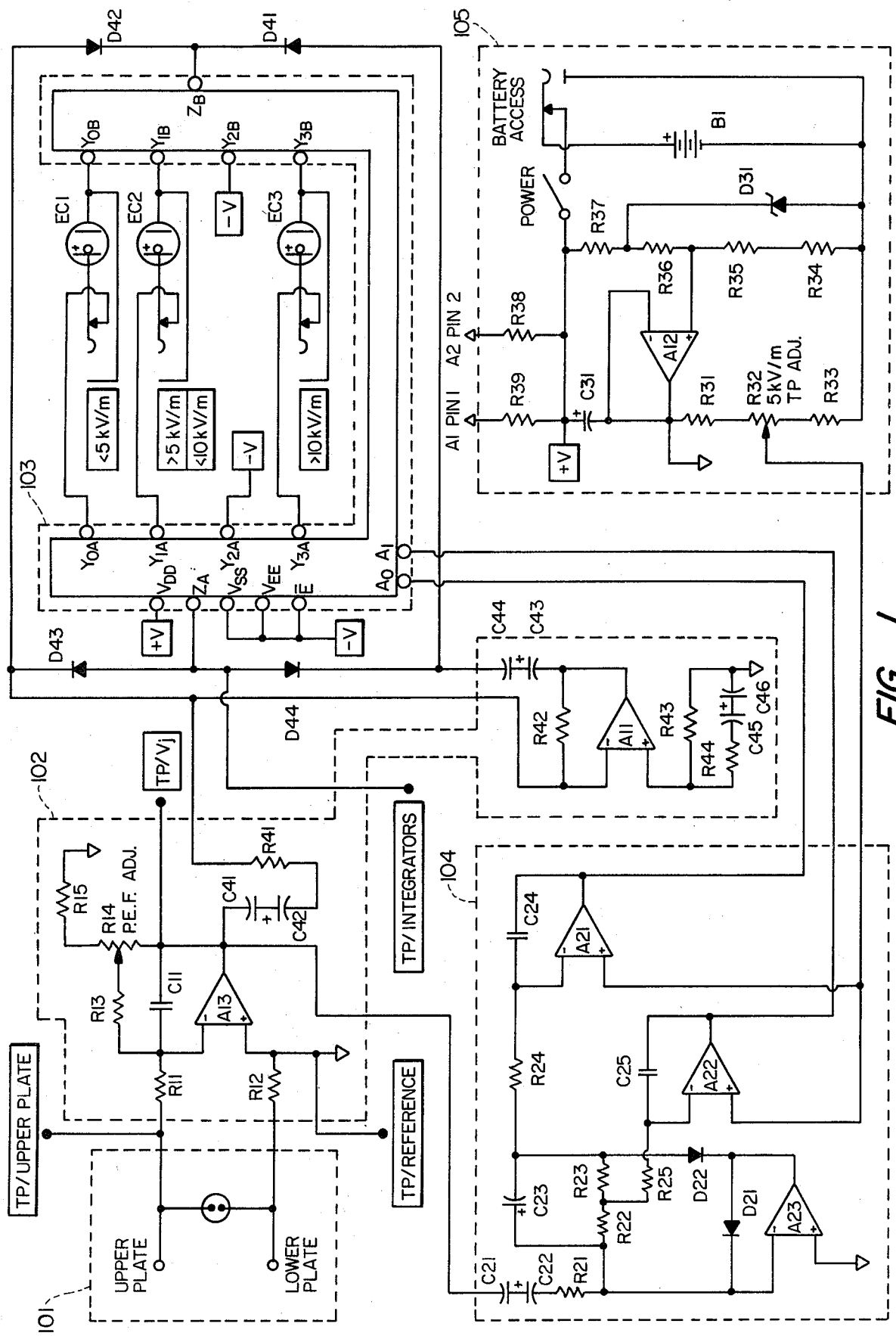
FIG_1

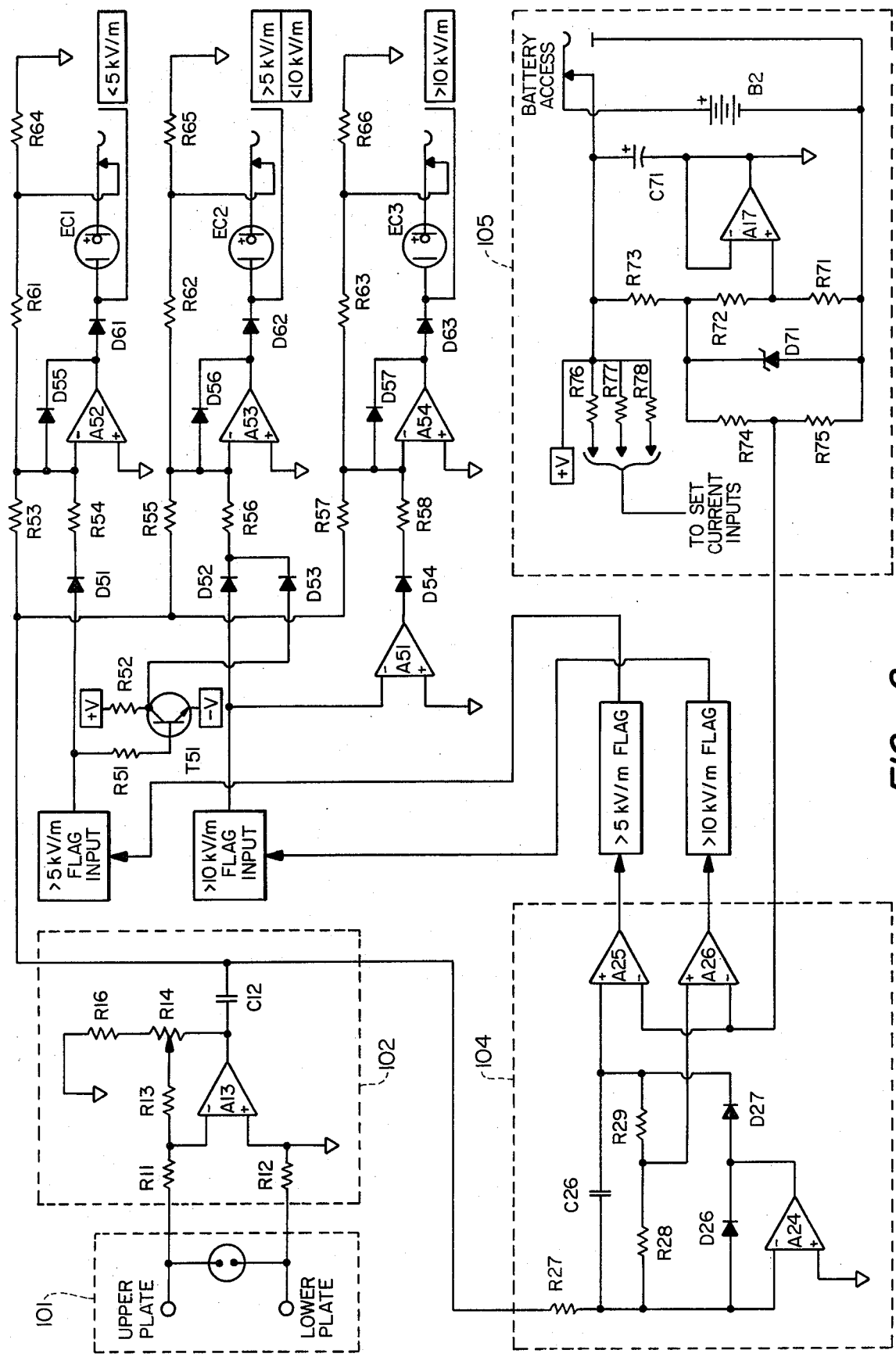
FIG_2

PERSONAL ELECTRIC FIELD EXPOSURE MONITOR

This invention relates generally to an electric field exposure meter and more particularly to such a meter for monitoring electric fields which enclose currents in the human body.

Currents are induced in the body of people who are in the presence of the electric field produced by high voltage transmission lines and in the vicinity of substations. The exact knowledge of the degree of exposure or dose from induced currents in the body is of primary importance so that biological studies of the long term exposure effects can be related to electric fields.

Prior work in the area (Dr. Don W. Deno, "Currents Induced in the Human Body by High Voltage Transmission Line Electric Field—Measurement and Calculation of Distribution and Dose," *IEEE Transactions on Power Apparatus and Systems*, Vol. PAS-96, No. 5, pp. 1517–1527, September/October 1977) defined the electric field dose as the time integral of the unperturbed electric field, expressed in (kV/m) hr. The total electric field exposure was measured with a dosimeter and the time integral of induced body currents were calculated with a body current distribution formula. However, the prior work failed to distinguish 10 hours in a 4 kV/m field (where the field is not perceived) from 1 hour of mild discomfort in a 40 kV/m field or 40 minutes in an uncomfortable 60 kV/m field. Further discussions emphasized the concept of establishing thresholds and the advantage of measuring the time spent in selected windows of electric field intensity.

Accordingly, it is an object of this invention to measure the electric field dose of people who are in the presence of the electric field produced by high voltage power transmission.

It is another object of this invention to measure over time the induced body current proportioned to the electric field.

A further object of this invention is to measure the electric field dose by integrating the exposure within selected windows of electric field intensity.

Another object of this invention is to measure the electric field dose by integrating over time the exposure within selected windows of electric field intensity of less than 5 kV/m, between 5 and 10 kV/m, and greater than 10 kV/m.

The present invention is directed to a system for monitoring low frequency electric field exposure which comprises a sensor for sensing an electric field at a selected location and generating an electrical signal indicative of the strength of the electric field, a switching means to receive said electrical signal and to switch, as a function of the electric field intensity, said electrical signal to one of a plurality output terminals, and a plurality of integrating means each connected to receive the switched electrical signal from one of said plurality of output terminals and each capable of storing a signal representative of the time integral of the electric field intensity.

FIG. 1 is a detailed schematic diagram of the preferred embodiment of a personal electric field exposure monitor.

FIG. 2 is a detailed schematic diagram of an alternate embodiment of a personal electric field exposure monitor.

Referring to FIG. 1, there is shown a sensor 101 for sensing an alternating electric field at a selected location and generating an alternating electrical signal indicative of the strength of the electric field. The sensor may, for example, comprise spaced sheets of foil, one acting as a lower or ground plate and the other as the upper or pick-up plate. The foils may be sandwiched between sheets of polyethylene to maintain their spacing.

The alternating electrical signal from sensor 101 is amplified by amplifier 102 comprising operational amplifiers A13 and A11 and the associated resistors and capacitors. The alternating electrical signal is first amplified and inverted by operational amplifier A13 and the output of A13 is then inverted again by operational amplifier A11. Amplifier 102 thereby produces alternating electrical signals from operational amplifiers A13 and A11 that are 180° out-of-phase.

The out-of-phase signals from amplifier 102 are rectified by a full-wave rectifier comprising bridged diodes D41, D42, D43 and D44. The full-wave rectified output of the diode bridge is applied across the two inputs, $Z_A$ and $Z_B$, of a dual 1:4 demultiplexor 103, such as a National Semiconductor DM 74052.

Demultiplexor 103 receives the full-wave rectified signal across input $Z_A$ of one of the dual 1:4 demultiplexor circuits and $Z_B$ of the other 1:4 demultiplexor circuit contained within. By selectively addressing the two 1:4 demultiplexor circuits at the address inputs $A_0$ and $A_1$, the rectified signal can be switched to one of the four demultiplexor circuit outputs, thereby selectively switching the rectified signal across onr pair of the four pair of output terminals ($Y_{0A}$ & $Y_{0B}$, $Y_{1A}$ & $Y_{1B}$, $Y_{2A}$ & $Y_{2B}$, or $Y_{3A}$ & $Y_{3B}$) of demultiplexor 103.

Demultiplexor 103 is selectively addressed by threshold detecting circuitry 104 comprising operational amplifiers A21, A22 and A23 and associated circuitry. The threshold detecting circuitry 104 receives the alternating electrical signal from the output of operational amplifier A13 and compares that signal to a 5 kV/m reference voltage supplied by reference voltage circuitry 105, comprising battery B1 and associated circuitry.

If the alternating electrical signal is less than the 5 kV/m reference voltage, as determined by operational amplifier A21, then one-half the alternating signal, generated by operational amplifier A23 and associated circuitry, is also less than the 5 kV/m reference voltage, as determined by operational amplifier A22 and operational amplifiers A21 and A22 will provide a positive voltage to both address inputs $A_0$ and $A_1$ of demultiplexor 103. The positive voltage at $A_0$ and $A_1$ selectively connects input $Z_A$ to output $Y_{0A}$ and input $Z_B$ to output $Y_{0B}$ of multiplexor 103. The rectified signal from the diode bridge is thereby conducted to outputs $Y_{0A}$ and $Y_{0B}$ of demultiplexor 103 and to an integrating means, comprising an ion transfer storage device EC1, connected across outputs $Y_{0A}$ and $Y_{0B}$.

If the alternating electrical signal is greater than the 5 KV/m reference voltage, as determined by operational amplifier A21, but one-half the alternating signal, generated by operational amplifier A23 and associated circuitry, is less than the 5 kV/m reference voltage, as determined by operational amplifier A22, then operational amplifier A21 will provide a ground level voltage to address input $A_0$ of demultiplexor 103 and operational amplifier A22 will provide a positive voltage to address input $A_1$ of demultiplexor 103. The grounded voltage at $A_0$ and the positive voltage at $A_1$ selectively connects input $A_A$ to output $Y_{1A}$ and input $Z_B$ to output $Y_{1B}$ of demultiplexor 103. The rectified signal from the diode bridge is thereby conducted to outputs $Y_{1A}$ and $Y_{1B}$ of demultiplexor 103 and to an integrating means, comprising an ion transfer storage device EC2, connected across outputs $Y_{1A}$ and $Y_{1B}$.

A dosimeter in accordance with the foregoing was constructed and successfully tested.

The circuit elements of the dosimeter had the following values:

| | |
|---|---|
| R11, R12, R13 | 100,000 ohms |
| R14 (adjustable) | 100,000 ohms |
| R15 | 10,000 ohms |
| R21 | 59,000 ohms |
| R22, R23, R24, R25, R26 | 100,000 ohms |
| R31 | 30,100 ohms |
| R32 (adjustable) | 200,000 ohms |
| R33, R34, R35, R36 | 1,000,000 ohms |
| R37 | 100,000 ohms |
| R38 | 10,000,000 ohms |
| R39 | 3,010,000 ohms |
| R41 | 30,100 ohms |
| R42, R43 | 10,000,000 ohms |
| R44 | 30,100 ohms |
| C11 | .001 $\mu$F |
| C21, C22, C23 | 3.3 $\mu$F |
| C24, C25 | 200 pF |
| C31 | 3.3 $\mu$F |
| C41, C42, C43, C44, C45, C46 | 3.3 $\mu$F |
| D21, D22 | 1 N 4148 |
| D31 | LVA 56 A |
| D41, D42, D43, D44 | 1 N 4148 |
| A11, A12, A13 | Siliconix L 144 BP |
| A21, A22, A23 | Siliconix L 144 BP |
| M21 | 4052 DM |
| B1 | Mallory 303996 |
| Transient suppressor | NE-2 |

An alternative embodiment of the invention is described in FIG. 2. Referring to FIG. 2, there is shown a sensor 101 for sensing an alternating electric field at a selected location and generating an alternating electrical signal indicative of the strength of the electric field. The sensor, as before, may comprise spaced sheets of foil, one acting as a lower or ground plate and the other as a lower or ground plate and the other as the upper or pick-up plate. The foils may be sandwiched between sheets of polyethylene to maintain their spacing. The alternating electrical signal from sensor 101 is amplified by amplifier 102 comprising operational amplifier A13 and the associated resistors and capacitors.

The amplified electrical signal is received by threshold detecting circuitry 104, comprising operational amplifiers A24, A25 and A26 and associated circuitry, and compared with a 5 kV/M, reference voltage supplied by reference voltage circuitry 105, comprising battery B2 and associated circuitry. If the amplified electrical signal is less than the 5 kV/M reference voltage, as determined by operational amplifier A25, then the electric field intensity is less than 5 kV/M and both the >5 kV/M and >10 kV/M Flag signals are disabled. If the amplified electrical signal is greater than the 5 kV/M reference voltage, as determined by operational amplifier A24 and associated circuitry, is less than the 5 kV/M reference voltage, as determined by operational amplifier A26, then the electric field intensity is between 5 and 10 kV/M and the >5 V/M Flag signal is enabled while the >10 kV/M Flag signal is disabled. If the amplified electrical signal and one-half the amplified electrical signal, generated by operational amplifier A24 and associated circuitry, are both greater than the 5 kV/M reference voltage, as determined by operational amplifiers A25 and A26 respectively, then the electric field intensity is greater than 10 kV/M and both the >5 kV/M and >10 kV/M Flag signals are enabled.

If both the >5 kV/M and >10 kV/M Flag signals are disabled then the electric field intensity is less than 5 kV/M and the amplified electrical signal is inverted by operational amplifier A52. Inverting amplifiers A53 and A54 are disabled. The amplified signal and its inverse are rectified by diodes D55 and D61 and the rectified signal is integrated and stored by an ion transfer storage device EC1.

If the >5 kV/M Flag signal is enabled and the >10 kV/M Flag signal is disabled then the electric field intensity is between 5 and 10 kV/M and the amplified electrical signal is inverted by operational amplifier A53. Inverting amplifiers A52 and A54 are disabled. The amplified signal and its inverse are rectified by diodes D56 and D62 and the rectified signal is integrated and stored by an ion transfer storage device EC2.

If both the >5 kV/M and >10 kV/M Flag signals are enabled then the electric field intensity is greater than 10 kV/M and the amplified electrical signal is inverted by operational amplifier A54. Inverting amplifiers A52 and A53 are disabled. The amplified signal and its inverse are rectified by diodes D57 and D63 and the rectified signal is integrated and stored by storage capacitor EC3.

A dosimeter in accordance with the alternate embodiment was also constructed with the following values and successfully tested:

| | |
|---|---|
| R11, R12, R13 | 100,000 ohms |
| R14 (adjustable) | 100,000 ohms |
| R16 | 3,300 ohms |
| R27 | 300,000 ohms |
| R28, R29 | 510,000 ohms |
| R51 | 1,000,000 ohms |
| R52 | 300,000 ohms |
| R53 | 270,000 ohms |
| R54 | 68,000 ohms |
| R55 | 560,000 ohms |
| R56 | 100,000 ohms |
| R57 | 1,000,000 ohms |
| R58 | 100,000 ohms |
| R61, R62, R63 | 1,000,000 ohms |
| R64, R65, R66 | 160,000 ohms |
| R71 | 390,000 ohms |
| R72 | 240,000 ohms |
| R73 | 27,000 ohms |
| R74 | 200,000 ohms |
| R75 | 370,000 ohms |
| R76, R77, R78 | 5,100,000 ohms |
| C12, C26 | .68 $\mu$F |
| C71 | 22 $\mu$F |
| D26, D27 | 1 N 4148 |
| D51, D52, D53, D54, D55, D56, D57 | 1 N 4148 |
| D71 | LVA 56A |
| A13, A17 | Siliconix L 144 CJ |
| A24, A25, A26 | Siliconix L 144 CJ |
| A51, A52, A53, A54 | Siliconix L 144 CJ |
| T51 | MPS 6520 |
| B2 | 8.4 volt |
| Transient suppressor | NE-2 |

In both the preferred and embodiments, once the rectified signal is switched to one of the storage capacitors (EC1, EC2, EC3), the ion transfer device stores an electrical charge representative of the time integral of the electric field intensity for the respective window of electric field intensity (e.g., less than 5 kV/M, between 5 and 10 kV/M, greater than 10 kV/M). Each integrating storage device is read out separately by measuring the time a current resets to zero the accumulated electrical ion transfer stored charge.

Thus, there has been provided an exposure monitor (dosimeter) capable of providing not only meansurement of total dosage of electrical field, but also measurement of dosage of different levels of field strength.

What is claimed is:

1. A system for monitoring low frequency electric fields comprising:
    a sensor for sensing an electric field at a selected location and generating an electrical signal indicative of the strength of the electric field;
    a switching means to receive said electrical signal and to switch, as a function of the electric field intensity, said electrical signal to one of a plurality of output terminals, and
    a plurality of integrating means, one each of said plurality of integrating means connected to receive the switched electrical signal from a corresponding one of said plurality of output terminals and each capable of storing an electrical signal representative of the time integral of the corresponding electric field intensity so as to measure electric field dosage.

2. A system as in claim 1 further comprising a means to measure the integrating means stored by an integrating means and to reset the electrical signal following a measurement.

3. A system as in claim 1, in which the switching means comprises an addressable multiplexor that is selectively addressed with the output signals generated by a plurality of electric field intensity threshold detectors connected to receive said electrical signal.

4. A system for monitoring low frequency electric fields comprising:
    a sensor for sensing electric fields at a selected location and generating electrical signals indicative of the strength of the electric fields at the location;
    amplifying means serving to receive and amplify said electrical signals;
    a plurality of integrating means connected to selectively receive the amplified electrical signals;
    means responsive to said electrical signals for generating switching signals responsive to different amplitudes of electrical signals generated by electric fields of different intensities; and
    switching means for switching the amplified electrical signal to selected ones of said integrating means responsive to the switching signal whereby the integrating means store signals representing different field intensities in order to measure electric field dosage.

5. A system as in claim 4 wherein said switching means comprises an addressable multiplexor that is selectively addressed by said switching signals.

6. A system as in claim 4 in which said means responsive to said electrical signals includes means for comparing the amplitude of said signals to a reference voltage.

* * * * *

UNITED STATES PATENT AND TRADEMARK OFFICE
CERTIFICATE OF CORRECTION

PATENT NO. : 4,277,745

DATED : July 7, 1981

INVENTOR(S) : Don W. Deno

It is certified that error appears in the above-identified patent and that said Letters Patent are hereby corrected as shown below:

Column 2, line 31, between "across" and "pair", delete "onr" and substitute therefor --one--.

Column 5, line 5, after "only", delete "meansure-" and substitute therefor --measure- --.

Column 5, line 29, between "the" and "stored" delete "integrating means" and substitute therefor --electrical signal--.

Column 5, line 30, between "the" and "following", detele "electrical signal" and substitute therefor --integrating means--.

Signed and Sealed this

Third Day of November 1981

[SEAL]

Attest:

Attesting Officer

GERALD J. MOSSINGHOFF

Commissioner of Patents and Trademarks

UNITED STATES PATENT AND TRADEMARK OFFICE
CERTIFICATE OF CORRECTION

PATENT NO. : 4,277,745

DATED : July 7, 1981

INVENTOR(S) : Don W. Deno

It is certified that error appears in the above–identified patent and that said Letters Patent are hereby corrected as shown below:

Column 4, line 62, between "and" and "once", delete "embodiments," and substitute --alternate embodiment,--.

Signed and Sealed this

Second Day of March 1982

[SEAL]

*Attest:*

*Attesting Officer*

GERALD J. MOSSINGHOFF

*Commissioner of Patents and Trademarks*